US 8,872,546 B2

(12) United States Patent
Zou et al.

(10) Patent No.: US 8,872,546 B2
(45) Date of Patent: Oct. 28, 2014

(54) INTERFACE CIRCUITRY FOR A TEST APPARATUS

(75) Inventors: Peng Zou, Tumwater, WA (US); Fenardi Thenus, Portland, OR (US); David J. Harriman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 232 days.

(21) Appl. No.: 13/613,810

(22) Filed: Sep. 13, 2012

(65) Prior Publication Data

US 2014/0070846 A1    Mar. 13, 2014

(51) Int. Cl.
*H03K 19/0175*    (2006.01)

(52) U.S. Cl.
USPC .................................. 326/82; 326/39; 326/62

(58) Field of Classification Search
None
See application file for complete search history.

(56) References Cited

U.S. PATENT DOCUMENTS

| | | | |
|---|---|---|---|
| 5,844,913 A | 12/1998 | Hassoun et al. | |
| 7,817,727 B2 | 10/2010 | Kumar et al. | |
| 8,587,339 B2 * | 11/2013 | Johnson | 326/82 |
| 2003/0142240 A1 | 7/2003 | Masters | |
| 2005/0169321 A1 * | 8/2005 | Farley et al. | 370/535 |
| 2007/0296461 A1 | 12/2007 | Wong et al. | |
| 2011/0133788 A1 | 6/2011 | Liu et al. | |

OTHER PUBLICATIONS

International Searching Authority, "Notification of Transmittal of the International Search Report and the Written Opinion of the International Searching Authority," mailed Sep. 27, 2013, in International application No. PCT/US2013/047226.
Nick Holland, Texas Instruments, "Interfacing Between LVPECL, VML, CML, and LVDS Levels," Application Report—SLLA120, Dec. 2002, 23 pages.
U.S. Appl. No. 13/477,322, filed May 22, 2012, entitled "Providing a Load Store Communication Protocol With a Low Power Physical Unit," by Sridharan Ranganathan, et al.

* cited by examiner

*Primary Examiner* — Jany Richardson
(74) *Attorney, Agent, or Firm* — Trop, Pruner & Hu, P.C.

(57) ABSTRACT

In one embodiment, a test apparatus includes a field programmable gate array (FPGA) including a first transmitter to communicate first signals according to current mode logic (CML) signaling and a first receiver to receive second signals according to the CML signaling, and an interface circuit to couple the FPGA to a device that is to communicate according to voltage mode signaling. The interface circuit may adapt the first signals communicated by the first transmitter according to the CML signaling to voltage mode signaling signals for receipt by the device. Other embodiments are described and claimed.

28 Claims, 7 Drawing Sheets

INTERFACE CIRCUITRY FOR A TEST APPARATUS

BACKGROUND

Design and development of an integrated circuit (IC) is a complex, time consuming, and expensive process. To aid in these activities, often times a design team will use a field programmable gate array (FPGA), which is a programmable IC that may be used for purposes of testing and prototyping aspects of the IC design. Many FPGA's provide various configurable interfaces such as a high speed input/output (IO) module that may be used to avoid the costly and time-consuming process to perform application specific integrated circuit (ASIC) design and fabrication. The flexibility and versatility of FPGAs provide a very cost effective standard compliance testing apparatus in terms of both protocol and electrical attributes. However, most FPGA's configurable high-speed serial IO module, if not all, are based on a current mode logic (CML) transceiver and are thus incompatible with other electrical signaling modes such as voltage mode logic.

One area of IC development is with regard to designing ICs that incorporate a physical layer based on the Mobile Industry Processor Interface (MIPI) Alliance MIPI M-PHY specification Version 1.00.00—8 Feb. 2011 (MIPI Board Approved 28 Apr. 2011) (hereafter MIPI M-PHY specification), which is becoming widely adopted as the high-speed low power IO standard for serial interfaces within mobile devices. This physical layer, referred to herein as M-PHY, is developed as a stand-alone physical layer, and is intended for use with various higher level protocols.

DETAILED DESCRIPTION

In various embodiments, interface logic may be provided to enable a FPGA or other circuitry that communicates according to a CML electrical signaling mode to adapt to other circuitry that communicates according to a different electrical signaling mode, such as voltage mode logic. In particular embodiments, such interface logic may enable a CML interface of a FPGA to be compatible with a voltage mode interface such as a voltage mode transceiver of a device under test (DUT) that is in accordance with the MIPI M-PHY specification. In general, CML signaling and voltage mode signaling may both be implemented with differential signals; however, the different modes may operate at different common mode levels, although they may provide signals of the same swing. In an embodiment, this interface logic may be implemented using various off-the-shelf components and radio frequency (RF) modules.

In this way, an FPGA's CML interface may be made compatible with a voltage mode transceiver, e.g., using off-the-shelf components and RF modules. The compatibility may be realized by enabling one or more CML transceiver modules to emulate M-PHY interface's electrical attributes, and enable a protocol engine (e.g., an engine of an IC prototype design) implemented in the FPGA to communicate with real world devices (e.g., DUTs) having voltage mode signaling such as M-PHY-based designs.

By utilizing a configurable high speed IO module of a FPGA, cost efficient and fast development of MIPI M-PHY-based IO protocols may occur, while avoiding a costly and time-consuming process for ASIC design and fabrication. And, the flexibility and versatility of an FPGA provide a very cost effective standard compliance testing apparatus in terms of both protocol and electrical attributes.

Although the scope of the present invention is not limited in this regard, embodiments may be used in IC development of various devices such as peripheral devices, e.g., Unipro™ devices in accordance with the UniPro specification (1.40.00 version release Apr. 28, 2011), camera devices in accordance with the developing Camera Serial Interface (CSI-3) version 3, among others. The stand alone nature and architecturally low power attribute of M-PHY also make it attractive to be adapted with popular serial IO technologies in a personal computer (PC) platform. For example, a M-PHY may be adapted for use with a Super-Speed universal serial bus (USB) or a Peripheral Component Interconnect Express (PCIe™) protocol, to develop new low power IO technologies for future platforms, and other industry-wide initiatives such as a Super Speed Inter Chip (SSIC) standard (also referred to as low power Super-Speed USB) and low power PCIe™ by adapting upper layers of these communication protocols with a M-PHY physical layer.

Figure 1:
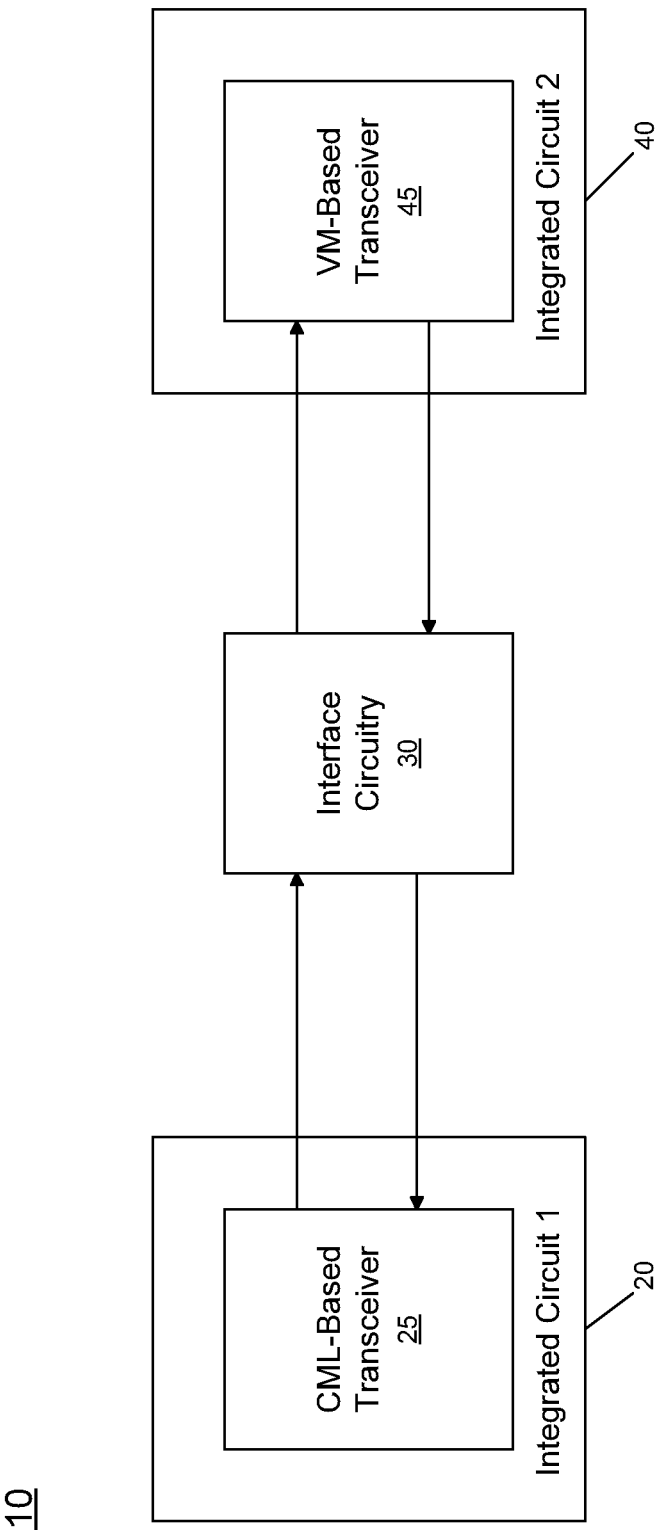
FIG. 1 is a block diagram of a high level view of a system in accordance with an embodiment of the present invention.

Referring now to FIG. 1, shown is a block diagram of a high level view of a system in accordance with an embodiment of the present invention. As seen in FIG. 1, system 10 may include multiple integrated circuits that are interconnected via interface circuitry. More specifically a first integrated circuit 20 may couple via interface circuitry 30 to a second integrated circuit 40. In an embodiment, first IC 20 may include programmable logic and may be a FPGA that includes various standard programmable logic blocks as provided by an FPGA manufacturer, as well as one or more programmable logic blocks of an IC or other circuit under development that have been programmed into the FPGA. Relevant to the discussion here, first IC 20 includes a current mode logic (CML)-based transceiver 25 that may include both receiver and transmitter, e.g., a high speed receiver and transmitter, that may provide for communication of signals according to a given CML protocol such as via a given type of low voltage differential signals. Or course, additional circuitry may be present in first IC 20, including other low speed interface circuits, as well as other fixed and programmable logic.

Different implementations of system 10 may exist in different embodiments. For example, in one embodiment the system may be realized as a printed circuit board in which the ICs are affixed to the circuit board, e.g., via soldering, surface mounts or according to another connection technology. In turn, interface circuitry 30 may be implemented via various traces and in-circuit components of the circuit board. Thus in such implementation a connectorless design may be provided in which interface circuitry 30 is configured within internal components of a circuit board. Instead, in other embodiments such as a test bench-based arrangement, the ICs may be configured to a test apparatus, with interface circuitry implemented by various off-the-shelf components that may be interconnected together using standard types of connector mechanisms. Accordingly, in different implementations a connector-based or a connectorless system may be realized.

As further seen in FIG. 1, IC 40 may also be present. This IC may be a commercially available IC that includes a voltage mode (VM) transceiver 45. Thus using interface circuitry 30, appropriate processing and manipulation of signals being provided in both directions may be realized to accommodate different electrical signaling protocols. As one example, second IC 40 may be an interface circuit such as a display/graphics interface, e.g., according to a Display Port™ technology in which the transceiver has an M-PHY physical layer. Although shown at this high level in the embodiment of FIG. 1, understand the scope of the present invention is not limited in this regard.

Figure 2:
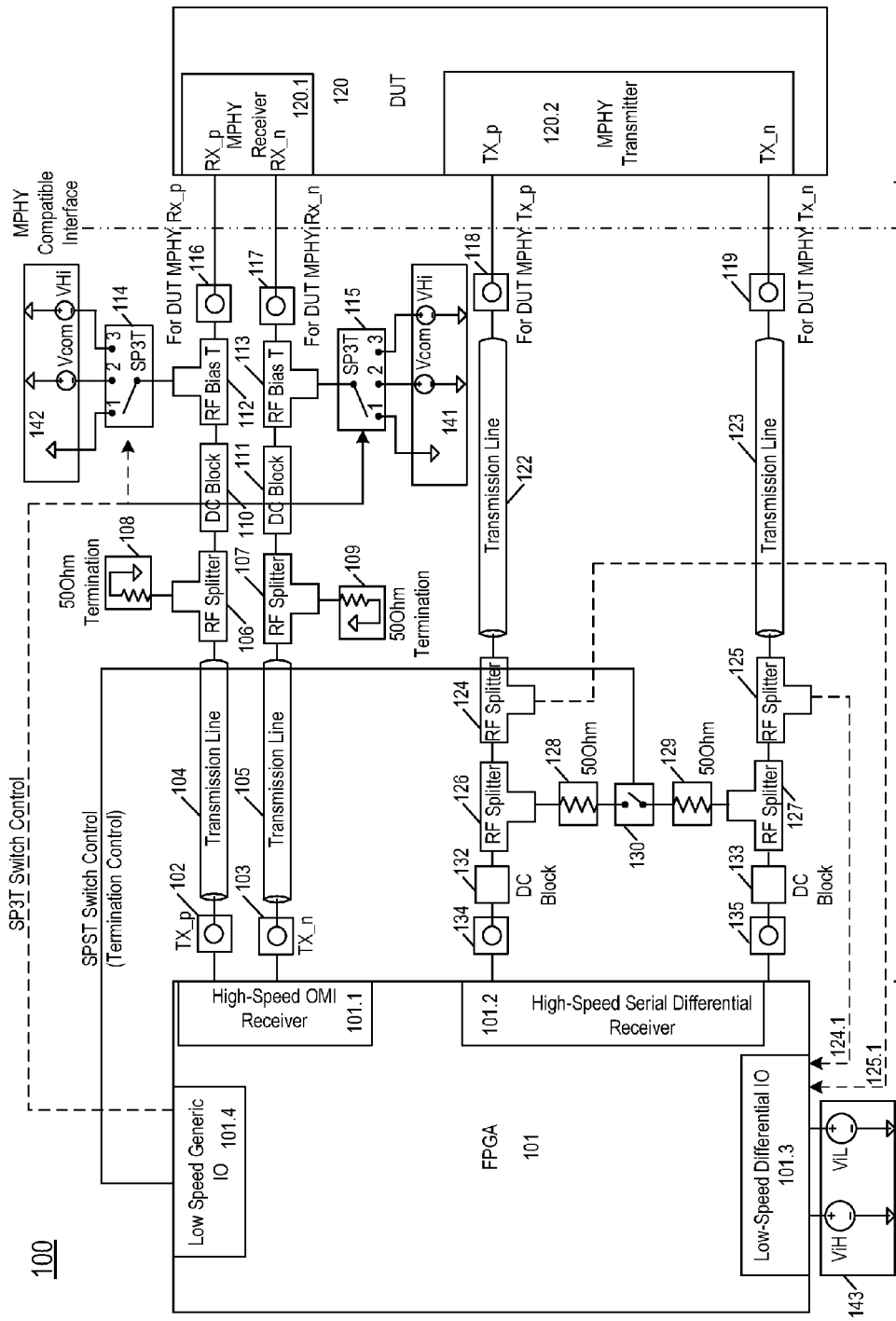
FIG. 2 is a schematic diagram of a test apparatus in accordance with an embodiment of the present invention.

Referring now to FIG. 2, shown is a schematic diagram of a test apparatus in accordance with an embodiment of the present invention. As shown in FIG. 2, apparatus 100 may be used to provide compatibility between a CML interface of a FPGA and a voltage mode transceiver. More specifically, apparatus 100 enables CML transceiver modules of the FPGA to emulate voltage mode electrical attributes of a device under test, which in an embodiment may be a M-PHY based device. In this way, a protocol engine implemented in the FPGA (which is part of a design of an IC under development) may communicate with real M-PHY based devices. At a high level, the apparatus includes a FPGA 101, an interface circuit 150, and a device 120.

In an embodiment FPGA 101 may include a configurable high-speed serial IO module having a CML transceiver. In one embodiment the transceiver may be a Xilinx Virtex series Rocket IO or a GTX transceiver module and may include a configurable CML transmitter 101.1 and a configurable receiver 101.2. Receiver 101.2 may include in front of its analog front end internal (on-chip) termination that may be configured to be biased to a reference voltage (e.g., ground), a positive voltage, or floating between differential positive and negative signal pins. Receiver 101.2 may also support AC coupling internally between its internal termination and analog front end inputs. This receiver module may also provide the option to make termination open circuit, as enabled by a switch 130, described further herein. Although shown in FIG. 2 as a differential receiver, understand the scope of the present invention is not limited in this regard.

If a serial differential receiver has internal disableable floating termination, and internal AC coupling sufficient for the lower end of the frequency band of M-PHY signaling (e.g., tens of kilo Hertz), various components (e.g., components 126, 127, 128, 129, 130, 132, and 133) of interface circuit 150 may be omitted, and their combined functionality may be equivalently realized by available on-chip features. For many receivers in commercially available FPGA products, one or more of these possibly optional components (e.g., components 126, 127, 128, 129, 130, 132, and 133) may be present to create an interface electrically compatible with a device having voltage mode signaling such as an M-PHY device.

In an arrangement including one or more external components, internal DC coupling may be enabled for the receiver's analog front end, and internal termination may be configured as floating or disabled.

Still referring to FIG. 2, a low speed IO bank 101.3 may include a plurality of interfaces that may be configured as low voltage differential signaling (LVDS) or low voltage positive-emitter coupled logic (LVPECL) compatible differential receivers (or combinations thereof). According to one embodiment, four such differential receivers may be used to realize a detection function for special link signaling modes of the MIPI M-PHY specification (e.g., DIF-N and DIF-P), as will be described further below.

A low speed logic IO bank 101.4 may be configured to provide transistor-transistor logic (TTL) compatible logic signals for controlling external switches. Nodes 102 and 103 are positive and negative output nodes of the differential transmitter output from FPGA 101, respectively. In various embodiments, these nodes may be configured as mounted RF connectors, such as SMA or other types of standard connectors. In an implementation having no connections, these nodes may be configured as impedance controlled printed circuit board traces. Coupled to nodes 102 and 103 is a differential transmission line pair 104 and 105. In various embodiments, these transmission lines may be implemented as a coaxial cable pair in a connector-based implementation, or impedance controlled printed circuit board traces in a connectionless arrangement. Note that various components of the interface circuitry may be similarly implemented using mounted RF connectors, such as SMA or other types of standard connectors. Alternately in an implementation having no connections, these components may be configured as impedance controlled printed circuit board traces.

As further shown in FIG. 2, a pair of RF splitters 106 and 107 may be coupled to the differential line pair and may be implemented as connector-based stand-alone modules, or as solder-down components in a no connector implementation. Note that for ease of discussion various components of the circuitry are referred to in pairs; however understand that in the differential implementation shown, a reference to a single component may be considered to include a pair of such components, both positive and negative. Each of the three ports of each splitter 106 and 107 is impedance matched to 50 ohms. As seen, one port of each splitter is coupled to ground with 50 ohm termination impedances 108 and 109. With such termination, CML transmitter-required electrical attributes may be satisfied.

Coupled to the output ports of RF splitters 106 and 107 are a pair of DC blocks 110 and 111. These DC blocks output a differential AC signal realized from the signal output by CML transmitter 101.1. In an embodiment these DC blocks may be implemented using series capacitors. Coupled to the DC blocks are a pair RF bias tees 112 and 113 that add correct common mode voltage to the extracted AC differential signal to form M-PHY compatible electrical signals. In an embodiment, the bias tee ports interfacing DC blocks 110 and 111 and nodes 116 and 117 are of 50 ohm impedance.

A corresponding switch 114 and 115 may be coupled to one port of each of the corresponding RF bias tees 112 and 113. In an embodiment, these switches may be single pole triple throw (SP3T) switches that may be implemented as a field effect transistor (FET) switch, electro-mechanical relay switch, or electro-opto relay switch. As seen in FIG. 2, these switches may be controlled from a switch control signal communicated from low speed IO module 101.4. The control signal may be TTL signal compatible, in an embodiment.

During high-speed data transmissions from transmitter 101.1, switches 114 and 115 may be switched to position 2, applying a common mode voltage (e.g., a M-PHY compatible common mode voltage) from a corresponding voltage source 141 and 142. Voltage sources 141 and 142 may be used to set common mode voltage and DIF-N/DIF-P voltage amplitude. In various embodiments, the voltage source may be realized by variable voltage sources or power supplies. When the link state is to be controlled to be set to the M-PHY defined DIF-N signal, switch 114 switches to position 1, and switch 115 switches to position 3 (in an embodiment) to thus cause both lines to communicate a diff-N signal (with the positive signal line coupled to ground and the negative line coupled to a supply voltage). To set the lines as DIF-P, switch 114 moves to position 3, and switch 115 switches to position 1 (in an embodiment), to thus cause both lines to communicate a DIF-P signal (with the positive signal line coupled to a supply voltage and the negative line coupled to ground).

Nodes 116 and 117 are positive and negative input nodes of a differential receiver 120.1 of a M-PHY device 120, respectively. These nodes may be mounted RF connectors, such as SMA or other types of standard connectors, or impedance controlled printed circuit board traces in a no connector implementation.

In various embodiments, device 120 may be any type of device such as a peripheral device, a baseband processor, or an interface device that communicates according to a protocol that uses a M-PHY physical layer. As seen, device 120 has a M-PHY interface including receiver 120.1 and transmitter 120.2. Of course, not shown in FIG. 2 for ease of illustration is the various logic of the IC, which receives signals from receiver 120.1 and provides signals to transmitter 120.2 for output. Also understand that in other embodiments, the interface may be according to another voltage mode-based scheme. Coupled to transmitter module 120.2 are positive and negative output nodes 118 and 119, which may be mounted RF connectors, such as SMA or other types of standard connectors, or impedance controlled printed circuit board traces in a no connector implementation.

Coupled to these output nodes is a differential transmission line pair 122 and 123, connecting transmitter 120.2 to receiver 101.2 of FPGA 101. A pair of RF splitters 124 and 125 having 50 ohm port impedance couple respective elements of the transmission line pair to enable line signals to be tapped to IO module 101.3 within FPGA 101. The tapped or split signals connected via lines 124.1 and 125.1 may be received within IO module 101.3 to realize M-PHY-required squelch and DIF-N/DIF-P detection functions.

An additional pair of RF splitters 126 and 127 (also having 50 ohm port impedance) forward differential signals into receiver 101.2 of FPGA 101, while forming a receiver termination branch between positive and negative nodes. In the embodiment shown, DC blocks 132 and 133 may be coupled to the output of RF splitters 126 and 127, respectively. Note that the placement order of RF splitters 124 and 126 may be reversed so that splitter 124 is located between DC block 132 and splitter 126 (and similarly the placement order of splitters 125 and 127 may be reversed, with splitter 125 located between DC block 133 and splitter 127). This alternative placement of components realizes the equivalent functionality.

To enable appropriate terminations, a pair of resistors 128 and 129, each which may be configured as a 50 ohm series resistor, form a 100 ohm floating impedance termination between the input nodes of receiver 101.2. As seen, these resistors may be switchably controlled to be switched into or out of the transmission path to FPGA 101. In the embodiment shown a switch 130 may control the selection of these resistors. In one embodiment, switch 130 is a single pole single throw (SPST) switch that is controlled by a TTL level signal communicated from low speed IO interface 101.4.

Embodiments provide for configurability of the test apparatus to enable emulation and handling of the different operations set forth in the MIPI M-PHY specification. These operations include certain link states to enable low power modes of operation. In an embodiment, available low power link states include a Hibern8, STALL, and SLEEP link states. During any of these low power link states, switch 130 may be configured in an open circuit between its 2 terminals. Thus, the termination at the receiver input is disabled. Hibern8, STALL and SLEEP are 3 power saving states of an M-PHY link. Hibern8 state enables ultra-power consumption of an M-PHY transceiver in which the M-PHY transmitter is high impedance, and the receiver holds the line at DIF-Z. STALL is the power saving state for M-PHY's high speed mode in which the receiver is unterminated, and the transmitter drives DIF-N. SLEEP is the power saving state for low-speed mode, in which the receiver is unterminated, and the transmitter drives DIF-N. Line state DIF-P is a positive differential voltage driven by the M-PHY transmitter. Line state DIF-N is a negative differential voltage driven by the M-PHY transmitter. Line state DIF-Z is a weak zero differential voltage maintained by the M-PHY receiver.

Instead, during an enabled power mode in which an active link state is in effect to enable communication of information via the link, such as a HS-Burst or Sys-Burst link state, switch 130 may be configured to electrically connect its 2 terminals to enable termination at the receiver input. To minimize the impedance discontinuity impact to high speed signaling, the 2 terminals (ports) of switch 130 may have a characteristic impedance of 50 ohm for impedance matching with resistors 128 and 129. In an embodiment, switch 130 may be realized by a RF FET switch, RF electro-mechanical switch, or electro-opto relay switch.

Still referring to FIG. 2, FPGA 101 includes a generic low speed programmable IO module 101.3 that may be implemented as a plurality of banks (generally bank 101.3). In an embodiment, this IO bank 101.3 may be configured as LVPECL receivers. Although only a single bank is shown for ease of illustration, understand that embodiments may include a plurality of IO banks.

In one particular embodiment, four low speed IO banks 101.3 may be present to enable receipt of 4 independent differential signals. In this way, the IO banks may be used to realize DIF-N/DIF-P link signal detection functionality that enables an M-PHY transceiver's link state transition signaling. A voltage source 143 may be coupled to IO bank 101.3 to provide voltage signals that may be used for threshold comparisons. As an example, voltage source 143 may provide high and low voltage thresholds for determining whether the line signal is in a DIF-N, DIF-P or squelch state. Of course, while a single voltage source is shown, understand that a plurality of such sources may be provided, each to provide multiple voltage signals to a corresponding IO bank. Or in other embodiments, a single voltage source may be configured to provide multiple voltage signals to the present IO banks. In an embodiment, voltage source 143 may be realized by any variable voltage source or power supply.

Figure 3:
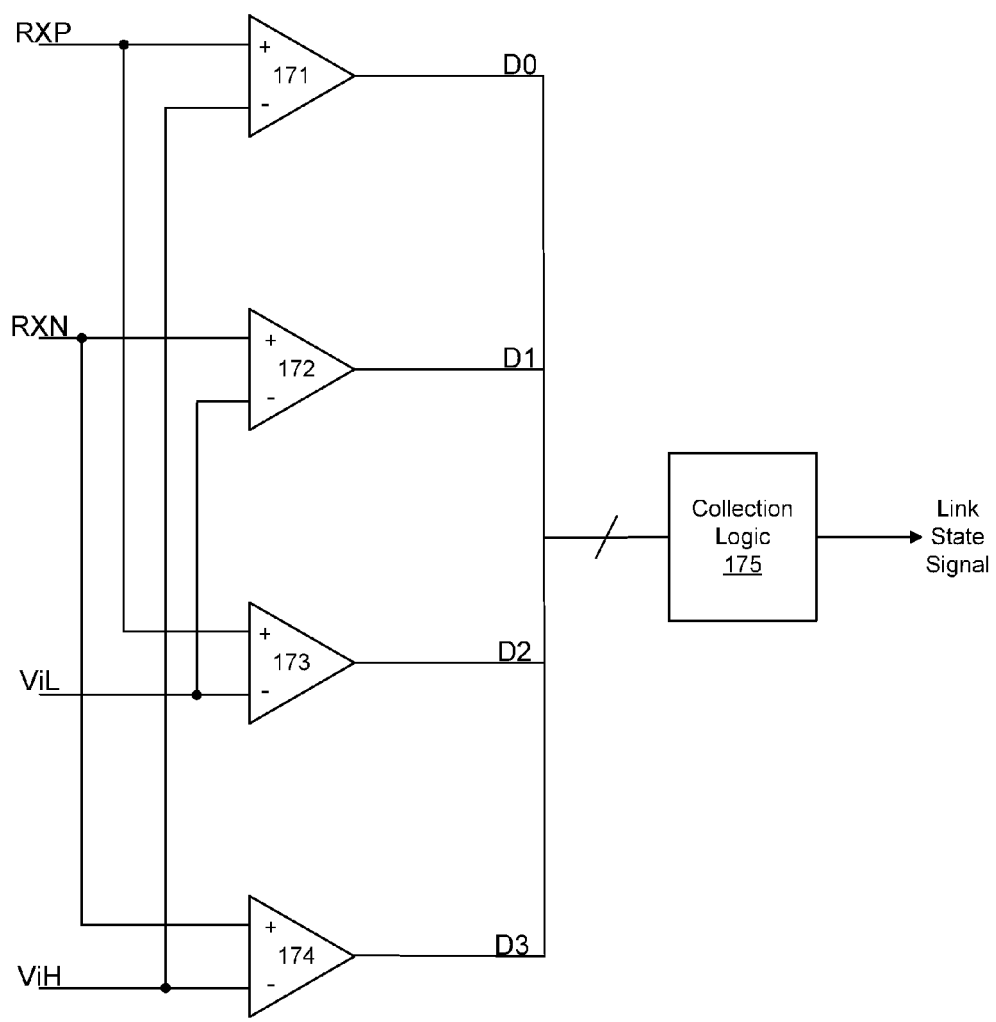
FIG. 3 is a schematic diagram of a detection mechanism in accordance with one embodiment of the present invention.

FIG. 3 is a schematic diagram of a detection mechanism in accordance with one embodiment of the present invention. As seen in FIG. 3, an input circuit 170 (which may be implemented as a plurality of IO bank) uses LVDS or LVPECL differential signals tapped off from the main signal path coupled between a DUT and the FPGA. Specifically, a plurality of comparators 171, 172, 173, and 174 each are coupled to receive at a positive input terminal one of the positive data signal RXP, obtained from positive data line 124.1 (in FIG. 2) and the negative data signal RXN, tapped off negative data line 125.1 of FIG. 2. The determination as to whether a DIF-N, DIF-P, or squelch (DIF-Z) state is presented on the differential transmission lines may be based on the output of these comparators. As further seen, each comparator is coupled to receive at a negative input terminal one of multiple threshold voltages, with ViL being a low threshold voltage and ViH being a high threshold voltage.

In an embodiment, the high threshold voltage may be set as a logic high voltage less a margin, e.g., 50 millivolts (mV). In turn, the low threshold voltage may be set as a logic low voltage plus a margin, e.g., 50 mV. In one embodiment: ViH=VoH−50 mV and ViL=VoL+50 mV.

As further seen in FIG. 3, the outputs of the various comparators may be coupled to a collection logic 175 which may include logic to receive these signals and to determine a state on the line based on the values. This collection logic may be part of an IO module, or may be implemented in a logic programmed into the FPGA. In an embodiment, the determination may be in accordance with Table 1 below.

TABLE 1

|  | D0 | D1 | D2 | D3 |
| --- | --- | --- | --- | --- |
| DIF-P | 1 | 0 | 1 | 0 |
| DIF-N | 0 | 1 | 0 | 1 |
| DIF-Z | Any other combinations | | | |

Thus based upon the receipt of these tapped signals, collection logic 175 may determine whether device 120 is driving a DIF-P or DIF-N line state. In the M-PHY protocol, a transition from DIF-N to DIF-P indicates that the link state going out of a power saving state, e.g., STALL or SLEEP state. DIF-N signal indicates that the link is in a power saving state. DIF-Z is a weak differential zero maintained by receiver, indicating that the link is in HIBERN8 state. Transmitter 101 may drive the line to DIF-N state to signal that the link is transitioning out of the HIBERN8 state. Note that this collection logic may thus generate a state signal to indicate the state on the link and provide this signal, e.g., to logic of the FPGA, such as logic of the IC under development to enable various testing, compatibility, or other operations with regard to these states.

Embodiments thus may be used as low cost and fast prototyping method for M-PHY related IP development. In addition, embodiments may be used for compliance testing fixture/method for various communication protocols.

Figure 4:
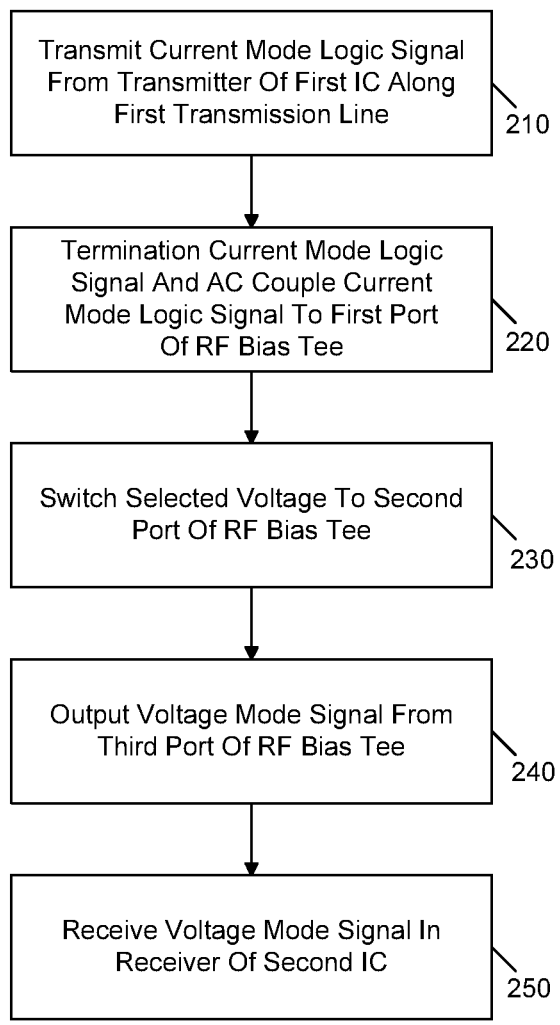
FIG. 4 is a flow diagram of a method for adapting current mode signals for receipt by a voltage mode-based receiver in accordance with an embodiment of the present invention.

Referring now to FIG. 4, shown is a flow diagram for adapting current mode logic signals for communication to a voltage mode-based device. As seen in FIG. 4, method 200 may begin by transmitting a CML signal from a transmitter of a first IC along a first transmission line (block 210). As one example, the signal may be a differential signal communicated along a differential transmission line, e.g., such as an LVDS or an LVPECL signal. As seen, at block 220 the CML signal may be terminated and AC coupled to a first port of an RF bias tee. At block 230 a selected voltage may be switched to a second port of the RF bias tee. This selection may be realized by switching a given voltage to the RF bias tee port based on the signal to be communicated. As examples, depending on the type of signal, a ground voltage, a supply voltage, or a common mode voltage may be provided to the second port of the RF bias tee.

As such, at block 240 a voltage mode signal may be realized and output from a third port of the bias tee. At block 250 this voltage mode signal may be received in a receiver of the second IC. Although described at this high level in the embodiment of FIG. 4, understand the scope of the present invention is not limited in this regard.

Figure 5:
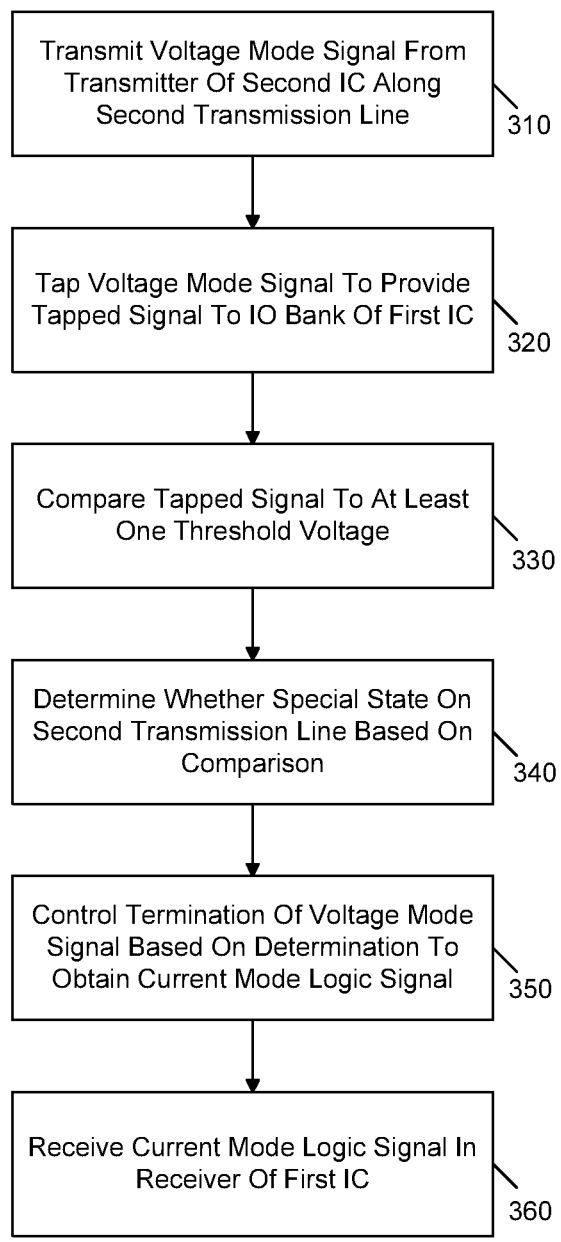
FIG. 5 is a flow diagram of a method for adapting voltage mode signals for receipt by a current mode-based receiver in accordance with an embodiment of the present invention.

Referring now to FIG. 5, shown is a method for adapting voltage mode signals for receipt by a current mode-based receiver. As seen in FIG. 5, method 300 may begin by transmitting a voltage mode signal from a transmitter of a second IC along a second transmission line (block 310). Again, in certain embodiments, this second signal may be a differential signal. Next at block 320, this voltage mode signal may be tapped. The tapped signal may be provided to an IO bank of the first IC. Note that although only a single IO bank is described, in many implementations multiple such banks may be provided, each of which may receive the tapped signal.

Next at block 330 this tapped signal may be compared to at least one threshold voltage. In an embodiment, multiple threshold voltages may be provided, e.g., a high and low threshold voltage may be provided to enable a comparison to the tapped signal which in an embodiment may be a differential signal. Based on this comparison, at block 340 it may be determined whether a special state is being communicated on the second transmission line. Although the scope of the present invention is not limited in this regard, the special state may be one of a DIF-N, DIF-P, or a squelch state (DIF-Z).

Based on this determination, termination of the voltage mode signal may be controlled. For example, a termination impedance may be coupled between differential lines of the second transmission line if a normal data signal is being communicated on the line. Instead in a special state of the line, such as a low power state, this termination may be opened or disabled. Still referring to FIG. 5, at block 360 a current mode signal may be received in a receiver of the first IC.

Accordingly, the embodiments of FIGS. 4 and 5 provide methods to adapt signals of one type of electrical signaling to another type of electrical signaling to enable their ready communication between different ICs using interface circuitry in accordance with an embodiment of the present invention.

Figure 6:
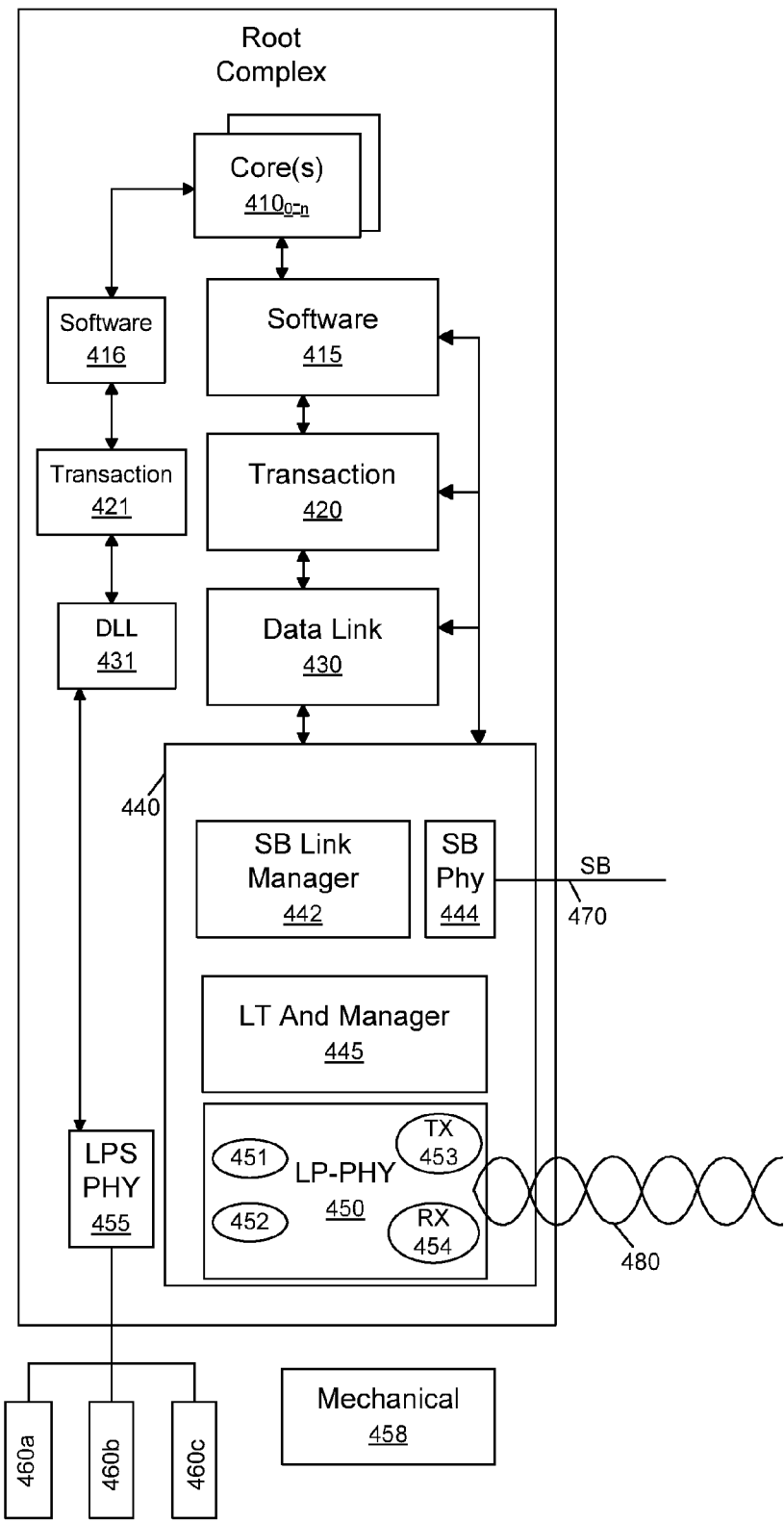
FIG. 6 is a block diagram of a system-on-a-chip (SoC) in accordance with an embodiment of the present invention.

Referring now to FIG. 6, shown is a block diagram of a SoC that may be designed in part using a test apparatus in accordance with an embodiment of the present invention. As shown in FIG. 6, SoC 400 may be any type of SoC for implementation into various types of platforms, ranging from relatively small low power portable devices such as smartphones, personal digital assistants (PDAs), tablet computers, netbooks, Ultrabooks™ and so forth, to more advanced SoCs that may be implemented in higher level systems. This SoC may be designed by programming various logic of the SoC into a FPGA and testing it with a test apparatus as described herein.

As seen in FIG. 6, SoC 400 may include one or more cores $410_0$-$410_n$. Thus in various embodiments, a multicore SoC is possible, where the cores all may be homogeneous cores of a given architecture, e.g., an in-order or out-of-order processor. Or there may be heterogeneous cores, e.g., some relatively small low power cores, e.g., of an in-order architecture, with additional cores present that may be of a larger and more complicated architecture, e.g., an out-of-order architecture. A protocol stack enables communication of data between one or more of these cores and other components of a system. As seen, this stack may include software 415, which may be higher level software such as OS, firmware, and application level software that executes on one or more of the cores. In addition, the protocol stack includes a transaction layer 420 and a data link layer 430. In various embodiments, these transaction and data link layers may be of a given communication protocol such as a PCIe™ protocol. Of course, layers of different protocol stacks such as in accordance with a universal serial bus (USB) protocol stack may be present in other embodiments. Also, in some implementations low power PHY circuitry as described herein may be multiplexed with existing alternate protocol stacks.

Still referring to FIG. 6, in turn this protocol stack may couple to a physical unit 440 that may include multiple physical units that may provide for communication via multiple interconnects. In one embodiment, a first physical unit 450 may be a low power PHY unit that in one embodiment may correspond to an M-PHY in accordance with the MIPI specification to provide communication via a primary interconnect 480. In addition, a sideband (SB) PHY unit 444 may be present. In the embodiment shown, this sideband PHY unit may provide for communication via a sideband interconnect 470, which may be a consolidated sideband to provide certain sideband information, e.g., at slower data rates than primary interconnect 480 that is coupled to first PHY 450. In some embodiments, the various layers of the protocol stack may have a separate sideband coupling to this SB PHY 444 to enable communication along this sideband interconnect.

In addition, PHY unit 440 may further include an SB link manager 442 that may be used to control SB PHY 444. In addition, a link training and state manager 445 may be present and may be used to adapt the protocol stack, which is of a first communication protocol, to first PHY 450, which is of a second communication protocol, as well as providing overall control of first PHY 450 and interconnect 480.

As further seen, various components may be present in first PHY 450. More specifically, transmitter and receiver circuitry (namely TX 453 and RX 454) may be present. In general, this circuitry may be used to perform serialization operations, deserialization operations along with the transmission and receipt of data via primary interconnect 480. A save state manager 451 may be present and may be used to save a configuration and other state information regarding first PHY 450 when it is in a low-power state. Also, a coder 452 may be present to perform line coding, e.g., according to an 8b/10b protocol.

As further seen in FIG. 6, a mechanical interface 458 may be present. This mechanical interface 458 may be a given interconnection to provide communication from root complex 400, and more specifically to/from first PHY 450 via primary interconnect 480. In various embodiments, this mechanical connection may be by way of pins of the semiconductor device such as a ball grid array (BGA) or other surface mount, or plated through hole connection.

In addition to these main communication mechanisms, an additional communication interface may be by way of a low power serial (LPS) PHY unit 455, coupled via a separate stack including a software layer 416, a transaction layer 421, and a link layer 431 between cores 410 and one or more off-chip devices 460a-c, which may be various low data rate peripheral devices such as sensors, accelerometers, temperature sensors, global positioning system (GPS) circuitry, compass circuitry, touch-screen circuitry, keyboard circuitry, mouse circuitry and so forth. Note that in various embodiments, both the sideband interconnect 470 and primary interconnect 480 may couple between SoC 400 and another semiconductor component, e.g., another IC, such as a multi-band radio solution.

Figure 7:
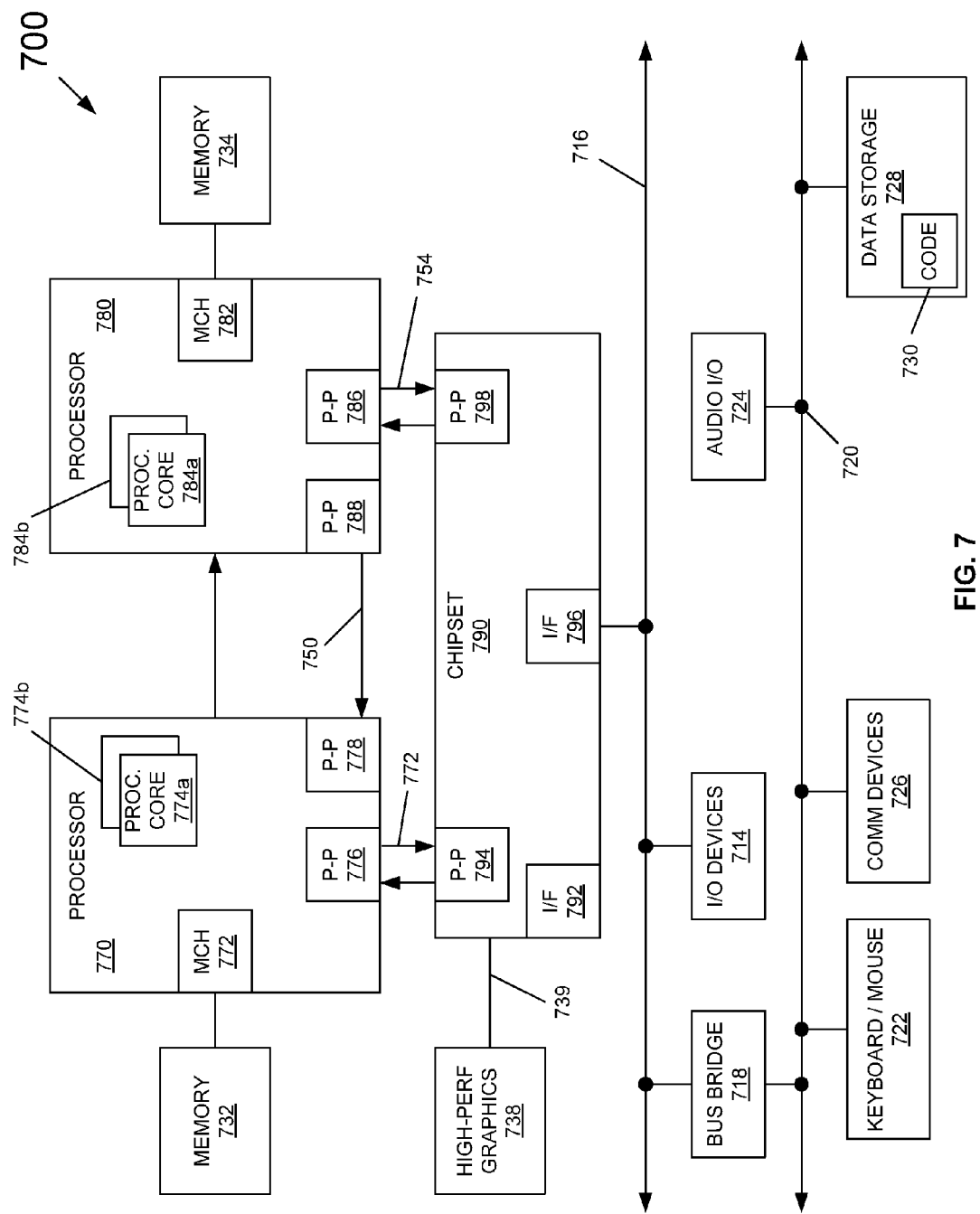
FIG. 7 is a block diagram of a system in accordance with an embodiment of the present invention.

Devices designed using a test apparatus in accordance with an embodiment may be implemented in many different system types. Referring now to FIG. 7, shown is a block diagram of a system in accordance with an embodiment of the present invention. As shown in FIG. 7, multiprocessor system 700 is a point-to-point interconnect system, and includes a first processor 770 and a second processor 780 coupled via a point-to-point interconnect 750. As shown in FIG. 7, each of processors 770 and 780 may be multicore processors, including first and second processor cores (i.e., processor cores 774a and 774b and processor cores 784a and 784b), although potentially many more cores may be present in the processors.

Still referring to FIG. 7, first processor 770 further includes a memory controller hub (MCH) 772 and point-to-point (P-P) interfaces 776 and 778. Similarly, second processor 780 includes a MCH 782 and P-P interfaces 786 and 788. As shown in FIG. 7, MCH's 772 and 782 couple the processors to respective memories, namely a memory 732 and a memory 734, which may be portions of system memory (e.g., DRAM) locally attached to the respective processors. First processor 770 and second processor 780 may be coupled to a chipset 790 via P-P interconnects 752 and 754, respectively. As shown in FIG. 7, chipset 790 includes P-P interfaces 794 and 798.

Furthermore, chipset 790 includes an interface 792 to couple chipset 790 with a high performance graphics engine 738, by a P-P interconnect 739. In turn, chipset 790 may be coupled to a first bus 716 via an interface 796. As shown in FIG. 7, various input/output (I/O) devices 714 may be coupled to first bus 716, along with a bus bridge 718 which couples first bus 716 to a second bus 720. Various devices may be coupled to second bus 720 including, for example, a keyboard/mouse 722, communication devices 726 and a data storage unit 728 such as a disk drive or other mass storage device which may include code 730, in one embodiment. Further, an audio I/O 724 may be coupled to second bus 720. Embodiments may be incorporated into other types of systems including mobile devices such as a smart cellular telephone, tablet computer, netbook, or so forth.

The following examples pertain to further embodiments.

In an embodiment, an apparatus includes an FPGA including a first transmitter to communicate first signals according to CML signaling and a first receiver to receive second signals according to the CML signaling; and an interface circuit to couple the FPGA to a device that is to communicate according to voltage mode signaling, the interface circuit to adapt the first signals communicated by the first transmitter according to the CML signaling to voltage mode signaling signals for receipt by the device.

The interface circuit may include: a first differential transmission line coupled to the first transmitter of the FPGA; a first RF splitter to couple the first differential transmission line to a first DC block, the first RF splitter further coupled to a first termination circuit; and a first RF bias tee coupled to the first DC block to provide the first signals according to the voltage mode signaling to the device.

The interface circuit further may include a first switch coupled to the first RF bias tee to couple a selected voltage to a first port of the first RF bias tee.

The FPGA may include an IO interface to communicate a switch control signal to the first switch to select the selected voltage from a first plurality of voltages.

The device may include an IC having a second receiver to receive signals according to the voltage mode signaling and a second transmitter to transmit signals according to the voltage mode signaling, the second receiver and the second transmitter including a physical layer according to a MIPI M-PHY specification.

The FPGA may include logic of an IC under development, the IC under development to include a communication protocol stack having upper layers according to a PCI specification and a physical layer according to the MIPI M-PHY specification.

The interface circuit may include a second differential transmission line coupled to the second transmitter of the IC to receive the second signals according to the voltage mode signaling, a second RF splitter to couple the second differential transmission line to a second 10 interface of the FPGA, and a third RF splitter to couple the second RF splitter to a second DC block, where the second DC block is to provide the second signals according to the CML signaling to the first receiver of the FPGA.

The apparatus may include a second voltage source to couple at least one selected threshold voltage to the second IO interface of the FPGA.

The second IO interface may include a plurality of banks, each including a comparator to compare a level on one of a positive and a negative portion of the second differential transmission line to a corresponding selected voltage level and to output a comparison signal.

A collection logic may receive the comparison signal from each of the plurality of banks and to provide a link state signal to a state machine logic.

The third RF splitter may include a positive splitter circuit to couple a positive splitter circuit of the second RF splitter and a positive DC block of the second DC block, and a negative splitter circuit to couple a negative splitter circuit of the second RF splitter and a negative DC block of the second DC block.

The apparatus may include a first termination impedance coupled to a first port of the positive splitter circuit of the third RF splitter and a second termination impedance coupled to a first port of the negative splitter circuit of the third RF splitter.

The apparatus may include a second switch to switchably couple the first termination impedance and the second termination impedance when active signals are communicated on the second differential transmission line.

In an embodiment, a method includes transmitting a CML signal from a transmitter of a first IC, and communicating the CML signal through an interface circuit to couple a voltage mode signal corresponding to the CML signal to a receiver of a second IC, including terminating the CML signal via a first termination circuit and AC coupling the first signal to a first port of a first RF bias tee; switching a selected voltage to a second port of the first RF bias tee; and outputting the voltage mode signal from a third port of the first RF bias tee to the receiver of the second IC.

In the method, switching the selected voltage to the second port of the first RF bias tee may include coupling the selected voltage via a first switch coupled to the second port of the first RF bias tee, responsive to a switch control signal received in the first switch from the first IC.

The method may include communicating signals between the first IC and the second IC to validate circuitry of an IC under development, the circuitry programmably configured in the first IC, where the first IC is an FPGA.

The method may include transmitting a second voltage mode signal from a transmitter of the second IC along a second transmission line, tapping the second voltage mode signal to provide a tapped signal to an IO bank of the first IC, comparing the tapped signal to at least one threshold voltage in the first IC, determining a state on the second transmission line based on the comparison, and controlling termination of the second voltage mode signal based on the determination to obtain a second CML signal.

The method may include receiving the second CML signal in a receiver of the first IC.

In an embodiment, a system may have a FPGA including a first transmitter to communicate first signals according to CML signaling and a first receiver to receive second signals according to the CML signaling; a first interface to communicate according to TTL signaling; a second interface to communicate according to low voltage differential signaling; and a logic of an integrated circuit under development. In turn, an interface circuit may couple the FPGA to a DUT that is to communicate according to voltage mode signaling, the interface circuit to adapt the first signals communicated by the first transmitter according to the CML signaling to voltage mode signaling for receipt by the DUT. The DUT may be coupled to the interface circuit, and includes a transceiver to communicate according to the voltage mode signaling.

The interface circuit includes: first differential transmission line coupled to the first transmitter of the FPGA; a first RF splitter to couple the first differential transmission line to a first DC block, the first RF splitter further coupled to a first termination circuit; and a first RF bias tee having a first port coupled to the first DC block and having a second port to provide the first signals according to the voltage mode signaling to the DUT and a third port coupled to a first switch to receive a selected voltage.

The interface circuit may further include a second differential transmission line coupled to the transceiver of the DUT to receive the second signals according to the voltage mode signaling; a second RF splitter to couple the second differential transmission line to the second interface of the FPGA, and a third RF splitter to couple the second RF splitter to a second DC block, where the second DC block is to provide the second signals according to the CML signaling to the first receiver of the FPGA.

The second interface may include a plurality of banks, each including a comparator to compare a level on one of a positive and a negative portion of the second differential transmission line to a corresponding selected voltage level and to output a comparison signal; and a collection logic to receive the comparison signal from each of the plurality of banks and to provide a link state signal to a state machine logic of the logic of the integrated circuit under development.

The FPGA and the DUT may be integrated circuits coupled to a circuit board, and the interface circuit includes at least one of conductors of the circuit board and components coupled to the circuit board.

In another embodiment, an apparatus includes interface logic adapted to be coupled to a first integrated circuit and a second integrated circuit, where the interface logic is configured to translate first signals of a current mode logic to be transmitted from the first integrated circuit to second signals of a voltage mode logic to be received by the second integrated circuit, and to translate third signals of the voltage mode logic to be transmitted by the second integrated circuit to fourth signals of the current mode logic to be received by the first integrated circuit.

The interface logic may include a first differential transmission line coupled to a transmitter of the first integrated circuit; a first RF splitter to couple the first differential transmission line to a first DC block, and further coupled to a first termination circuit; and a first RF bias tee coupled to the first DC block to provide the second signals of the voltage mode logic to the second integrated circuit.

The interface circuit may further include a first switch coupled to the first RF bias tee to couple a selected voltage to a first port of the first RF bias tee, and where the first integrated circuit further includes an TO interface to communicate a switch control signal to the first switch to select the selected voltage from a first plurality of voltages.

The interface logic also may include a second differential transmission line coupled to a transmitter of the second integrated circuit to receive the second signals according to the voltage mode logic; a second RF splitter to couple the second differential transmission line to a second IO interface of the first integrated circuit; and a third RF splitter to couple the second RF splitter to a second DC block, wherein the second DC block is to provide the fourth signals according to the current mode logic to a receiver of the first integrated circuit.

The second IO interface may include a plurality of banks, each including a comparator to compare a level on one of a positive and a negative portion of the second differential transmission line to a corresponding selected voltage level and to output a comparison signal, and a collection logic to receive the comparison signal from each of the plurality of banks and to provide a link state signal to a state machine logic of the first integrated circuit.

Embodiments may be implemented in code and may be stored on a non-transitory storage medium having stored thereon instructions which may be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a field programmable gate array (FPGA) including a first transmitter to communicate first signals according to current mode logic (CML) signaling and a first receiver to receive second signals according to the CML signaling; and
    an interface circuit to couple the FPGA to a device that is to communicate according to voltage mode signaling, the interface circuit to adapt the first signals communicated by the first transmitter according to the CML signaling to voltage mode signaling signals for receipt by the device.

2. The apparatus of claim 1, wherein the interface circuit comprises:
    a first differential transmission line coupled to the first transmitter of the FPGA;
    a first radio frequency (RF) splitter to couple the first differential transmission line to a first DC block, the first RF splitter further coupled to a first termination circuit; and
    a first RF bias tee coupled to the first DC block to provide the first signals according to the voltage mode signaling to the device.

3. The apparatus of claim 2, wherein the interface circuit further comprises a first switch coupled to the first RF bias tee to couple a selected voltage to a first port of the first RF bias tee.

4. The apparatus of claim 3, wherein the FPGA further includes an input/output (IO) interface to communicate a switch control signal to the first switch to select the selected voltage from a first plurality of voltages.

5. The apparatus of claim 1, wherein the device comprises an integrated circuit (IC) having a second receiver to receive signals according to the voltage mode signaling and a second transmitter to transmit signals according to the voltage mode signaling, the second receiver and the second transmitter including a physical layer according to a Mobile Industry Processor Interface (MIPI) MIPI M-PHY specification.

6. The apparatus of claim 5, wherein the FPGA includes logic of an IC under development, the IC under development to include a communication protocol stack having upper layers according to a Peripheral Component Interconnect (PCI) specification and a physical layer according to the MIPI M-PHY specification.

7. The apparatus of claim 5, wherein the interface circuit comprises:
    a second differential transmission line coupled to the second transmitter of the IC to receive the second signals according to the voltage mode signaling;
    a second RF splitter to couple the second differential transmission line to a second input/output (IO) interface of the FPGA; and
    a third RF splitter to couple the second RF splitter to a second DC block, wherein the second DC block is to provide the second signals according to the CML signaling to the first receiver of the FPGA.

8. The apparatus of claim 7, further comprising a second voltage source to couple at least one selected threshold voltage to the second IO interface of the FPGA.

9. The apparatus of claim 8, wherein the second IO interface comprises a plurality of banks, each including a comparator to compare a level on one of a positive and a negative portion of the second differential transmission line to a corresponding selected voltage level and to output a comparison signal.

10. The apparatus of claim 9, further comprising a collection logic to receive the comparison signal from each of the plurality of banks and to provide a link state signal to a state machine logic.

11. The apparatus of claim 7, wherein the third RF splitter comprises:
    a positive splitter circuit to couple a positive splitter circuit of the second RF splitter and a positive DC block of the second DC block; and
    a negative splitter circuit to couple a negative splitter circuit of the second RF splitter and a negative DC block of the second DC block.

12. The apparatus of claim 11, further comprising a first termination impedance coupled to a first port of the positive splitter circuit of the third RF splitter and a second termination impedance coupled to a first port of the negative splitter circuit of the third RF splitter.

13. The apparatus of claim 12, further comprising a second switch to switchably couple the first termination impedance and the second termination impedance when active signals are communicated on the second differential transmission line.

14. A method comprising:
    transmitting a current mode logic (CML) signal from a transmitter of a first integrated circuit (IC); and
    communicating the CML signal through an interface circuit to couple a voltage mode signal corresponding to the CML signal to a receiver of a second IC, including:
        terminating the CML signal via a first termination circuit and AC coupling the first signal to a first port of a first radio frequency (RF) bias tee;
        switching a selected voltage to a second port of the first RF bias tee; and
        outputting the voltage mode signal from a third port of the first RF bias tee to the receiver of the second IC.

15. The method of claim 14, wherein switching the selected voltage to the second port of the first RF bias tee comprises coupling the selected voltage via a first switch coupled to the second port of the first RF bias tee, responsive to a switch control signal received in the first switch from the first IC.

16. The method of claim 14, further comprising communicating signals between the first IC and the second IC to validate circuitry of an IC under development, the circuitry programmably configured in the first IC, wherein the first IC comprises a field programmable gate array (FPGA).

17. The method of claim 14, further comprising:
transmitting a second voltage mode signal from a transmitter of the second IC along a second transmission line;
tapping the second voltage mode signal to provide a tapped signal to an input/output (IO) bank of the first IC;
comparing the tapped signal to at least one threshold voltage in the first IC;
determining a state on the second transmission line based on the comparison; and
controlling termination of the second voltage mode signal based on the determination to obtain a second CML signal.

18. The method of claim 17, further comprising receiving the second CML signal in a receiver of the first IC.

19. A system comprising:
a field programmable gate array (FPGA) including:
a first transmitter to communicate first signals according to current mode logic (CML) signaling and a first receiver to receive second signals according to the CML signaling;
a first interface to communicate according to transistor-transistor logic (TTL) signaling;
a second interface to communicate according to low voltage differential signaling; and
a logic of an integrated circuit under development;
an interface circuit to couple the FPGA to a device under test (DUT) that is to communicate according to voltage mode signaling, the interface circuit to adapt the first signals communicated by the first transmitter according to the CML signaling to voltage mode signaling for receipt by the DUT; and
the DUT coupled to the interface circuit, wherein the DUT includes a transceiver to communicate according to the voltage mode signaling.

20. The system of claim 19, wherein the interface circuit comprises:
a first differential transmission line coupled to the first transmitter of the FPGA;
a first radio frequency (RF) splitter to couple the first differential transmission line to a first DC block, the first RF splitter further coupled to a first termination circuit; and
a first RF bias tee having a first port coupled to the first DC block and having a second port to provide the first signals according to the voltage mode signaling to the DUT, and a third port coupled to a first switch to receive a selected voltage.

21. The system of claim 19, wherein the interface circuit comprises:
a second differential transmission line coupled to the transceiver of the DUT to receive the second signals according to the voltage mode signaling;
a second RF splitter to couple the second differential transmission line to the second interface of the FPGA, and a third RF splitter to couple the second RF splitter to a second DC block, wherein the second DC block is to provide the second signals according to the CML signaling to the first receiver of the FPGA.

22. The system of claim 21, wherein the second interface comprises:
a plurality of banks, each including a comparator to compare a level on one of a positive and a negative portion of the second differential transmission line to a corresponding selected voltage level and to output a comparison signal; and
a collection logic to receive the comparison signal from each of the plurality of banks and to provide a link state signal to a state machine logic of the logic of the integrated circuit under development.

23. The system of claim 19, wherein the FPGA and the DUT are integrated circuits coupled to a circuit board, and the interface circuit comprises at least one of conductors of the circuit board and components coupled to the circuit board.

24. An apparatus comprising:
interface logic adapted to be coupled to a first integrated circuit and a second integrated circuit, wherein the interface logic is configured to translate first signals of a current mode logic to be transmitted from the first integrated circuit to second signals of a voltage mode logic to be received by the second integrated circuit, and to translate third signals of the voltage mode logic to be transmitted by the second integrated circuit to fourth signals of the current mode logic to be received by the first integrated circuit.

25. The apparatus of claim 24, wherein the interface logic comprises:
a first differential transmission line coupled to a transmitter of the first integrated circuit;
a first radio frequency (RF) splitter to couple the first differential transmission line to a first DC block, the first RF splitter further coupled to a first termination circuit; and
a first RF bias tee coupled to the first DC block to provide the second signals of the voltage mode logic to the second integrated circuit.

26. The apparatus of claim 25, wherein the interface logic further comprises:
a first switch coupled to the first RF bias tee to couple a selected voltage to a first port of the first RF bias tee, and wherein the first integrated circuit further includes an input/output (IO) interface to communicate a switch control signal to the first switch to select the selected voltage from a first plurality of voltages.

27. The apparatus of claim 24, wherein the interface logic comprises:
a second differential transmission line coupled to a transmitter of the second integrated circuit to receive the second signals according to the voltage mode logic;
a second RF splitter to couple the second differential transmission line to a second input/output (IO) interface of the first integrated circuit; and
a third RF splitter to couple the second RF splitter to a second DC block, wherein the second DC block is to provide the fourth signals according to the current mode logic to a receiver of the first integrated circuit.

28. The apparatus of claim 27, wherein the second IO interface comprises a plurality of banks, each including a comparator to compare a level on one of a positive and a negative portion of the second differential transmission line to a corresponding selected voltage level and to output a comparison signal, and a collection logic to receive the comparison signal from each of the plurality of banks and to provide a link state signal to a state machine logic of the first integrated circuit.

* * * * *